(12) United States Patent
Ware et al.

(10) Patent No.: US 12,032,845 B2
(45) Date of Patent: Jul. 9, 2024

(54) MEMORY CONTROLLER PARTITIONING FOR HYBRID MEMORY SYSTEM

(71) Applicant: Rambus Inc., San Jose, CA (US)

(72) Inventors: Frederick A. Ware, Los Altos, CA (US); John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 254 days.

(21) Appl. No.: 17/505,503

(22) Filed: Oct. 19, 2021

(65) Prior Publication Data
US 2022/0066672 A1  Mar. 3, 2022

Related U.S. Application Data

(63) Continuation of application No. PCT/US2020/028003, filed on Apr. 13, 2020.

(60) Provisional application No. 62/839,456, filed on Apr. 26, 2019.

(51) Int. Cl.
G06F 3/06 (2006.01)
(52) U.S. Cl.
CPC .......... *G06F 3/0644* (2013.01); *G06F 3/0604* (2013.01); *G06F 3/0679* (2013.01)
(58) Field of Classification Search
CPC ..... G06F 3/0604; G06F 3/061; G06F 12/0868
See application file for complete search history.

(56) References Cited

U.S. PATENT DOCUMENTS

| | | | |
|---|---|---|---|
| 5,926,827 A | 7/1999 | Dell et al. | |
| 9,837,135 B2 | 12/2017 | Chang et al. | |
| 9,940,980 B2 | 4/2018 | Lee et al. | |
| 10,241,727 B1 | 3/2019 | Shallal | |
| 2009/0031098 A1* | 1/2009 | Sartore | G06F 11/1441 711/E12.103 |
| 2010/0268887 A1 | 10/2010 | Ghai et al. | |

(Continued)

OTHER PUBLICATIONS

Notification of Transmittal of the International Search Report and the Written Opinion of the International Searching Authority, or the Declaration with Mail Date Aug. 10, 2020 re: Int'l Appln. No. PCT/US2020/028003. 16 pages.

(Continued)

*Primary Examiner* — David Yi
*Assistant Examiner* — Nicholas A. Paperno
(74) *Attorney, Agent, or Firm* — Silicon Edge Law Group LLP; Arthur J. Behiel (57) ABSTRACT

A compute system includes an execution unit (e.g. of a CPU) with a memory controller providing access to a hybrid physical memory. The physical memory is "hybrid" in that it combines a cache of relatively fast, durable, and expensive memory (e.g. DRAM) with a larger amount of relatively slow, wear-sensitive, and inexpensive memory (e.g. flash). A hybrid controller component services memory commands from the memory controller component and additionally manages cache fetch and evict operations that keep the cache populated with instructions and data that have a high degree of locality of reference. The memory controller alerts the hybrid controller of available access slots to the cache so that the hybrid controller can use the available access slots for cache fetch and evict operations with minimal interference to the memory controller.

11 Claims, 8 Drawing Sheets

(56) References Cited

U.S. PATENT DOCUMENTS

2011/0296118 A1 12/2011 Carter et al.
2015/0058527 A1 2/2015 Venkata
2016/0232112 A1 8/2016 Lee
2018/0059966 A1 3/2018 Lee et al.

OTHER PUBLICATIONS

Micron, "Mobile Low-Power DDR SDRAM," 128mb_mobile_ddr_sdram_t35m.pdf—Rev. F Mar. 2010 EN, © 2007 Micron Technology, Inc. 94 pages.
Samsung, "Target Mobile DRAM Stack Specification," © 2016 Samsung Electronics Co., Ltd., Rev. 0.0, Jul. 2016. 160 pages.
Gottscho et al., "X-Mem: A Cross-Platform and Extensible Memory Characterization Tool for Cloud," 2016 IEEE International Symposium on Performance Analysis of Systems and Software (ISPASS-2016). 11 pages.
Davis, "The next generation of storage disruption: storage-class memory," Network World, IDG Communications, Inc., Jan. 27, 2016. 1 page.

* cited by examiner

| Stat[0] | STp[3:0] | Sb | PAb[39:28] |
| Stat[1] | | | PAb[27:12] |
| 15 | | | 0 |

405 — Cached access status for 64B DRAM accesses for queue transactions from memory controller

| STp[3:0] | | | | command | description |
|---|---|---|---|---|---|
| 0 | 0 | 0 | 0 | nop | No operation |
| 0 | 0 | 0 | 1 | HIT | DRAM cache hit – 64B read or write performed |
| 0 | 0 | 1 | 0 | MISS$_{EF}$ | DRAM miss, Evict/Fetch buffers allocated, 4KB Fetch operation started, tags of ways of cache set returned (RD) |
| 0 | 0 | 1 | 1 | MISS$_{NO-EF}$ | DRAM miss, Evict/Fetch buffers not available, must retry read or write |
| 1 | x | x | x | rsrv | rsrv |
| x | 1 | x | x | rsrv | rsrv |

410 — Background access status (64x64B DRAM accesses) for 4KB Fetch/Evict operations (also for refresh)

| Sb[0] | command | description |
|---|---|---|
| 0 | nop | No operation |
| 1 | FetchDone | Fetch operation to PAb[39:12] finished (4KB group is in DRAM) – original RD/ WR can be RETRYed |

MEMORY CONTROLLER PARTITIONING FOR HYBRID MEMORY SYSTEM

FIELD OF THE INVENTION

The disclosed embodiments relate generally to memory systems, components, and methods.

BRIEF DESCRIPTION OF THE DRAWINGS

The detailed description is illustrated by way of example, and not by way of limitation, in the figures of the accompanying drawings and in which like reference numerals refer to similar elements and in which:

FIG. 2A depicts a compute system 200 that can in some ways be likened to system 100 of FIG. 1A, with like-identified elements being the same or similar.

DETAILED DESCRIPTION

A compute system includes an execution unit (e.g. of a CPU) with a memory controller providing access to a hybrid physical memory. A hybrid physical memory can combine a cache of relatively fast, durable, and expensive dynamic, random-access memory (DRAM) with a larger amount of relatively slow, wear-sensitive, and inexpensive memory (e.g. flash, resistive RAM, phase-change memory). This hybrid memory can approach the speed performance of standard DRAM modules while reducing the per-bit cost. A hybrid controller component can service memory commands from the memory controller component and additionally manage cache fetch and evict operations that keep the DRAM cache populated with instructions and data that have a high degree of locality of reference.

Figure 1A:
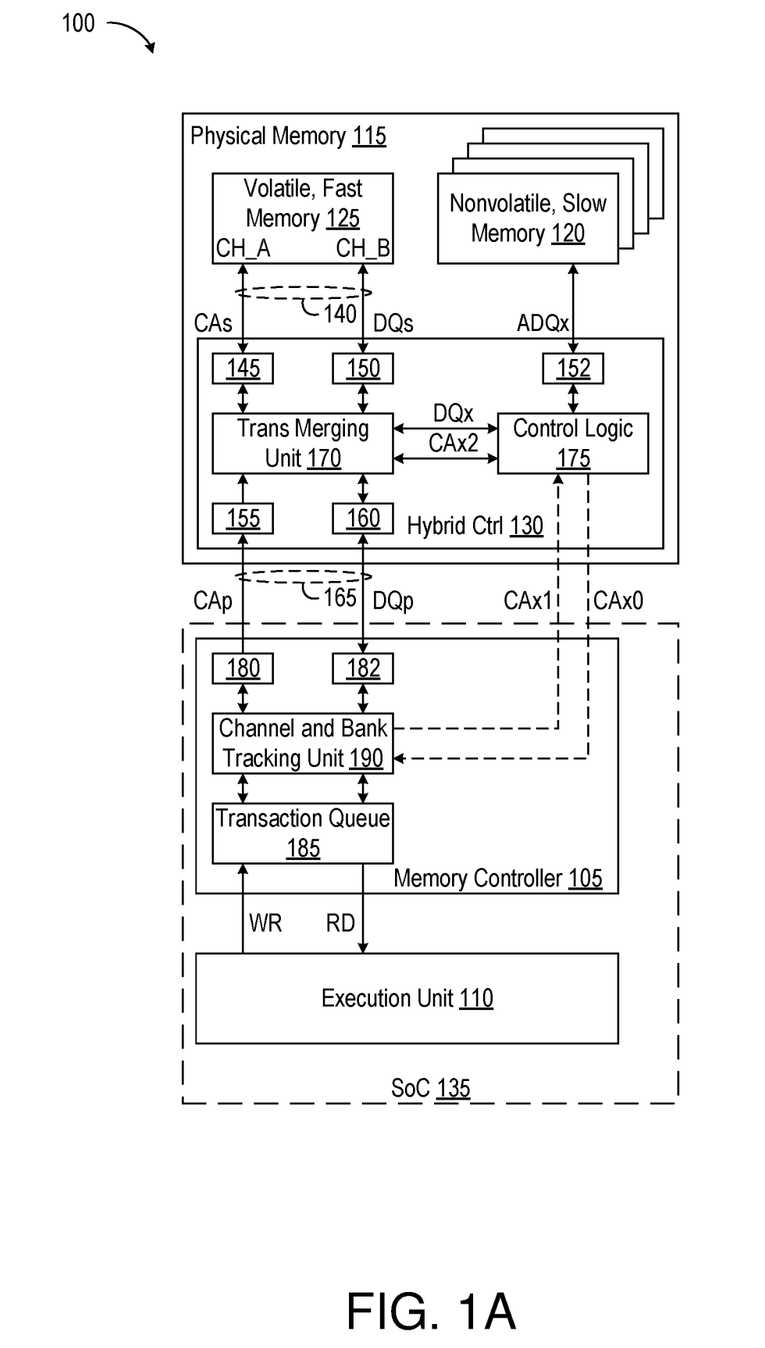
FIG. 1A depicts a compute system 100 in which a memory controller component 105 provides an execution unit 110 access to hybrid physical memory 115.

FIG. 1A depicts a compute system 100 in which a memory controller component 105 provides an execution unit 110 access to hybrid physical memory 115. Physical memory 115 includes one or more large, slow memory components 120 and one or more relatively small, fast memory components 125, each component including one or more interconnected integrated-circuit (IC) dies. In this context, large and small refer to data capacity and fast and slow to read and write speeds. Slow memory components 120 define a large address space that stores instructions and data in e.g. 4 KB blocks of slow-memory-component addresses. Fast memory components 125 define a relatively small address space that caches a subset (e.g. $1/16^{th}$) of the instructions and data in the large address space, a subset with a high degree of locality of reference. A hybrid controller component 130 linked to slow memory components 120 and fast memory components 125 copies 4 KB blocks of data between slow memory components 120 and fast memory components 125, in 64 B cache lines, as needed to maintain the locality of reference. Hybrid controller component 130 and memory controller component 105 work together to schedule cache maintenance operations to minimize the impact of cache synchronization on DRAM accesses in service of execution unit 110. In this embodiment, slow memory components 120 are nonvolatile flash memory, fast memory components 125 are DRAM, the cache-line size between the top cache level of the execution unit 110 and the memory 125 is 64 B, and the cache-line size between flow memory components 120 and fast memory components 125 is 4 KB.

Memory controller component 105 is linked to hybrid controller component 130 via primary command interface CAp and a primary data interface DQp. Memory controller component 105 issues commands and communicates data in service of read and write requests from execution unit 110. In this context "execution unit" refers to the portion of a processor that executes instructions from a computer program. Memory controller component 105 and execution unit 110 can be part of a common "system on a chip" (SoC) 135, a component that integrates various components in a computer or other electronic system on a common substrate. As used herein, a "component" refers to a part or element of a larger system, such as a compute system, and may include more than one IC die.

Hybrid controller 130 is coupled to fast memory components 125 via links 140 coupled to double-data-rate (DDR) DRAM command/address and data interfaces 145 and 150. DDR commands (e.g. read, write, bank activate, precharge, and refresh) specify a DRAM bank on one of two channels A and B (CH_A and CH_B). 64 B cache lines of data associated with read or write commands are conveyed bidirectionally over secondary data interface DQs in bursts over parallel data lines as DDR signals that transition on both rising and falling edges of a timing signal (not shown). Similar command/address and data interfaces 155 and 160 facilitate communication with memory controller component 105 via primary command/address interface CAp and data interface DQp over links 165. Hybrid controller 130 is also coupled to slow memory components 120 via links ADQx and an interface 152, which in one embodiment conforms to an interface specification known as ONFI, for "Open NAND Flash Interface." Other embodiments can use different interfaces and different types of volatile and nonvolatile memory.

Hybrid controller 130 fetches 4 KB blocks of data from slow memory components 120 to cache them in fast memory components 125 and evicts 4 KB blocks from fast memory components 125 as needed to make room for more recently used blocks. Block-wise operations each include sixty-four 64 B cache-line blocks (64×64 B=4 KB), the cache-line size of the top-level cache of execution unit 110. Hybrid controller 130 includes transaction-merging unit 170 and control logic 175 that note available DRAM transaction time slots and use them as needed in support of cache maintenance. Transaction-merging unit 170 responds to command/address signals on corresponding ports CAx2 and DQx in the same way it responds to similarly formatted signals from memory controller component 105. Hybrid controller 130 can be divided into "slices," each slice managing a subset of fast memory components 125 and slow memory components 120, to ease timing constraints on fetch and evict operations. The address mapping for physical memory 115 can spread cache lines across multiple banks of multiple devices or components.

Memory controller component 105 is coupled to hybrid controller 130 via links 165 coupled to DDR command/address and data interfaces 180 and 182. A transaction queue 185 maintains a list of pending memory transactions requested by execution unit 110, while a channel-and-bank tracking unit 190 keeps track of the banks, channels, and timings of those transactions.

Transactions within queue 185 should take precedence over cache-maintenance operations. Otherwise, memory controller component 105 will be interrupted by cache operations, leading to increased read and write latency and concomitant reductions in speed performance. Control logic 175 within hybrid controller 130 thus works with memory controller component 105 to identify timeframes, or "access slots," during which a bank/channel of physical memory 115 is not servicing memory transactions to a target responsive to requests from execution unit 110. Hybrid controller component 130 can use these available time slots for cache transactions without interfering with execution unit 110.

When hybrid controller 130 requires access to fast memory components 125, such as to evict a block of data from cache, control logic 175 passes the block address to memory controller component 105 via interface CAx0. Tracking unit 190 identifies available cache lines within the requested block and passes their addresses and related timing information back to control logic 175 via interface CAx1. Control logic 175 then makes use of the available access slots by issuing appropriately timed command, address, and possibly data signals to transaction-merging unit 170.

Each 4 KB cache operation is likely to involve many DRAM bank/channel combinations so control logic 175 will likely have some 64 B transactions to accomplish given a list of available access slots. In some embodiments hybrid controller 130 distributes the 64 B cache lines for each 4 KB block across multiple banks and devices within fast memory components 125. This technique increases the likelihood that at least one bank or device is available (not busy) to communicate a cache line in support of cache maintenance during each available access slot. If each 4 KB block is spread over sixty-four banks, for example, each bank storing one 64 B cache line, then it is highly likely that one of those banks will not be busy busying when an access slot is available for cache maintenance.

Memory controller component 105 can incorporate functionality from hybrid controller 130 and vice versa. However, partitioning the controller components such that cache maintenance is performed on an IC component separate from memory controller component 105 can be advantageous. For example, IC yield generally declines with area, thermal management may be easier across multiple components, and increased device periphery eases provision for external connections. Physical memory 115 can be instantiated on a memory module and used for storage-class memory (SCM). SCM products can operate like DRAM modules and can thus be more easily incorporated into legacy systems to provide relatively high apparent DRAM capacity and relatively low cost.

Figure 1B:
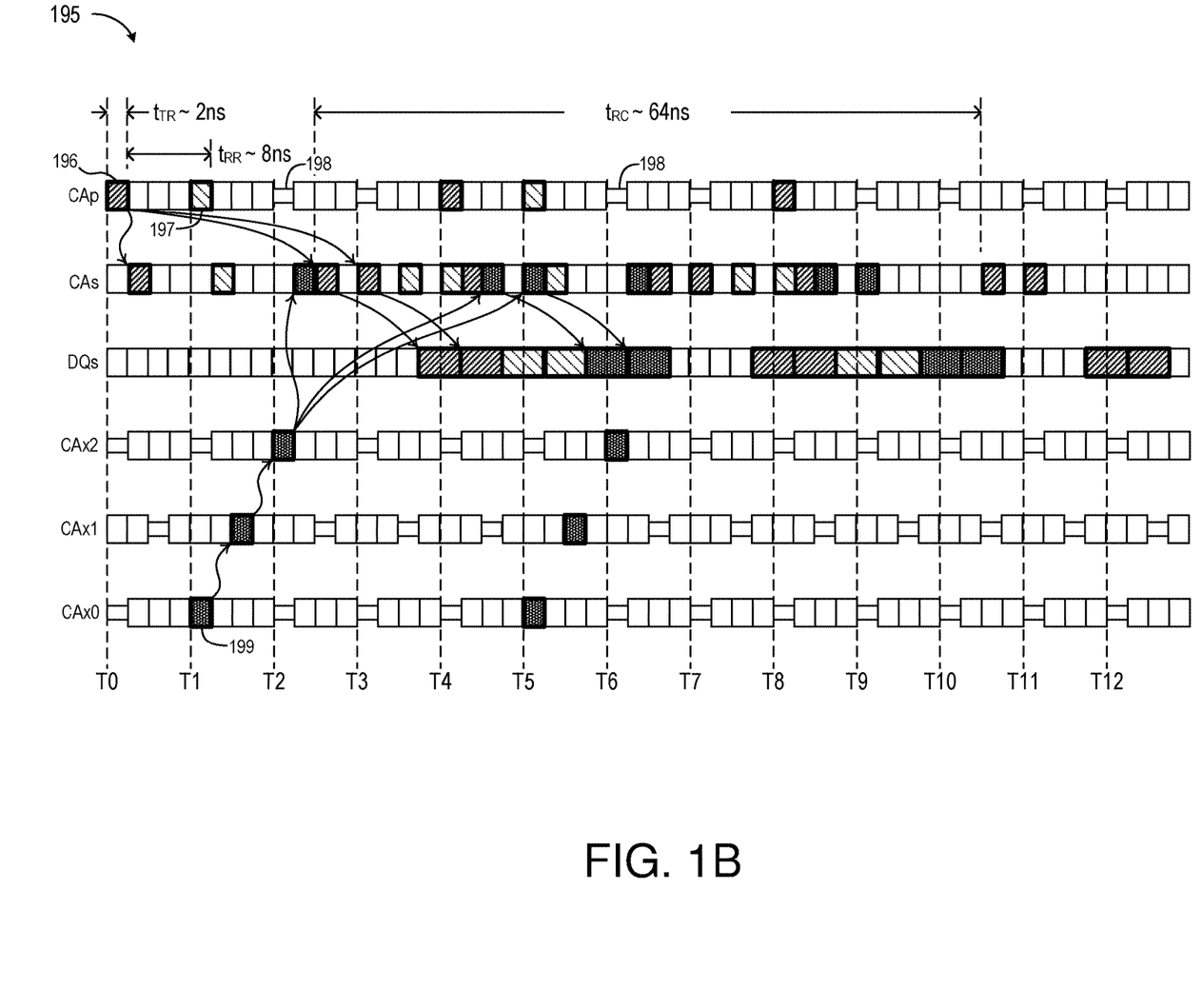
FIG. 1B is a timing diagram 195 illustrating how cache accesses to fast memory components 125 are inserted between execution-unit accesses for one channel in an embodiment of memory system 100 of FIG. 1A.

FIG. 1B is a timing diagram 195 illustrating how cache accesses to fast memory components 125 are inserted between execution-unit accesses for one channel in an embodiment of memory system 100 of FIG. 1A. The horizontal axis is divided into two-nanosecond (2 ns) clock cycles. Memory controller component 105 can issue a 64b command, which includes address and other bits, over primary command/address interface CAp on each cycle. A single such command can specify both a read or write command on behalf of execution unit 110 on one channel and a background, cache-maintenance read or write command in support of cache maintenance for hybrid controller component 130 on a second channel. Only e.g. two of eight channels will start a new read/write access in each 2 ns clock cycle. Formatting for such a hybrid command is detailed below in connection with FIG. 3. The following discussion treats cache-maintenance commands separately, however, for ease of illustration.

Fast memory components 125 have eight banks on each channel, each bank being independently accessible, a new bank every row-access time of eight nanoseconds ($t_{RR}$=8 ns). Sequential access to the same bank requires more time, sixty-four nanoseconds ($t_{RC}$=64 ns). Memory commands responsive to transactions in transaction queue 185 thus specify bank access slots that are unavailable to hybrid controller component 130 for a 64 ns window. Memory controller component 105 and hybrid controller component 130 work together to identify available access slots, gaps in the transaction stream from memory controller component 105, within which to insert cache synchronization operations (e.g., fetch and evict). Hybrid controller 130 is thus prevented from attempting to access an active bank within the $t_{RC}$ interval.

Beginning at time T0, and responsive to a request from execution unit 110, memory controller component 105 issues a read command 196 on primary interface CAp. Hybrid controller 130 responsively issues a sequence of commands on secondary interface CAs, a first command that identifies the channel, device, bank and row where the requested data resides and successive commands that identify a pair of column addresses. Read command 196 and related command and data signals are visually linked via common shading. Each of the two commands with a column address produces thirty-two eight-bit bursts of read data, collectively a 64 B cache line (2×32×8bits=64 B), which fast memory components 125 transmit on secondary data channel DQs. A second read command 197 at time T1 likewise results in a 64 B cache line directly following the first. Read command 197, like command 196, is visually linked to related signals via common shading. Timing slots depicted using relatively small boxes 198 indicate initial row command slots for unused transaction slots. In this example memory controller 105 uses five of thirteen transaction slots. The eight unused transaction slots afford control logic 175 of hybrid controller 130 access to fast memory components 125 for cache operations.

Memory controller 105 is not making use of the access slot available at time T2. Earlier however, at time T1 or earlier in this example, control logic 175 issued a command 199 over interface CAx0 indicating a need for a bank in fast memory components 125. As with commands 196 and 197 from memory controller component 105, command 199 from hybrid controller 130 is visually linked to related command and data signals via common shading. Tracking unit 190 can maintain a list of banks requested by control logic 175 and look for $t_{RC}$ intervals in which these banks will be available. Tracking unit 190 selects one of these available banks and issues a slot-availability command over channel CAx1 in time for control logic 175 to issue a corresponding command on interface CAx2. Hybrid controller 130, via transaction-merging unit 170, responsively issues a sequence of commands on secondary interface CAs. As a result, fast memory components 125 access a 64 B cache line on secondary data channel DQs immediately following the cache line from the prior transaction. The delay between commands on interface CAx0 and the available slot can be varied depending upon the transaction stream from memory controller component 105. The delay between commands on interface CAx1 and the available slot can be a fixed pipeline delay that can be adjusted to be long enough to accommodate hybrid controller 130.

The example of FIG. 1B continues with read or write transactions over the same DRAM channel initiated by execution unit 110—at times T4, T5, and T8—and for cache maintenance—at time T6. Secondary data channel DQs thus services execution unit 110 without interruption while allocating resources for cache maintenance. Though not shown, cached data are routed through transaction-merging unit 170, data interface DQx, and control logic 175 for writing to and reading from slow memory components 120. Hybrid controller 130 can include buffer memory to accumulate cache lines into complete blocks to provide block-wise read and write access to slow memory components 120.

Figure 2A:
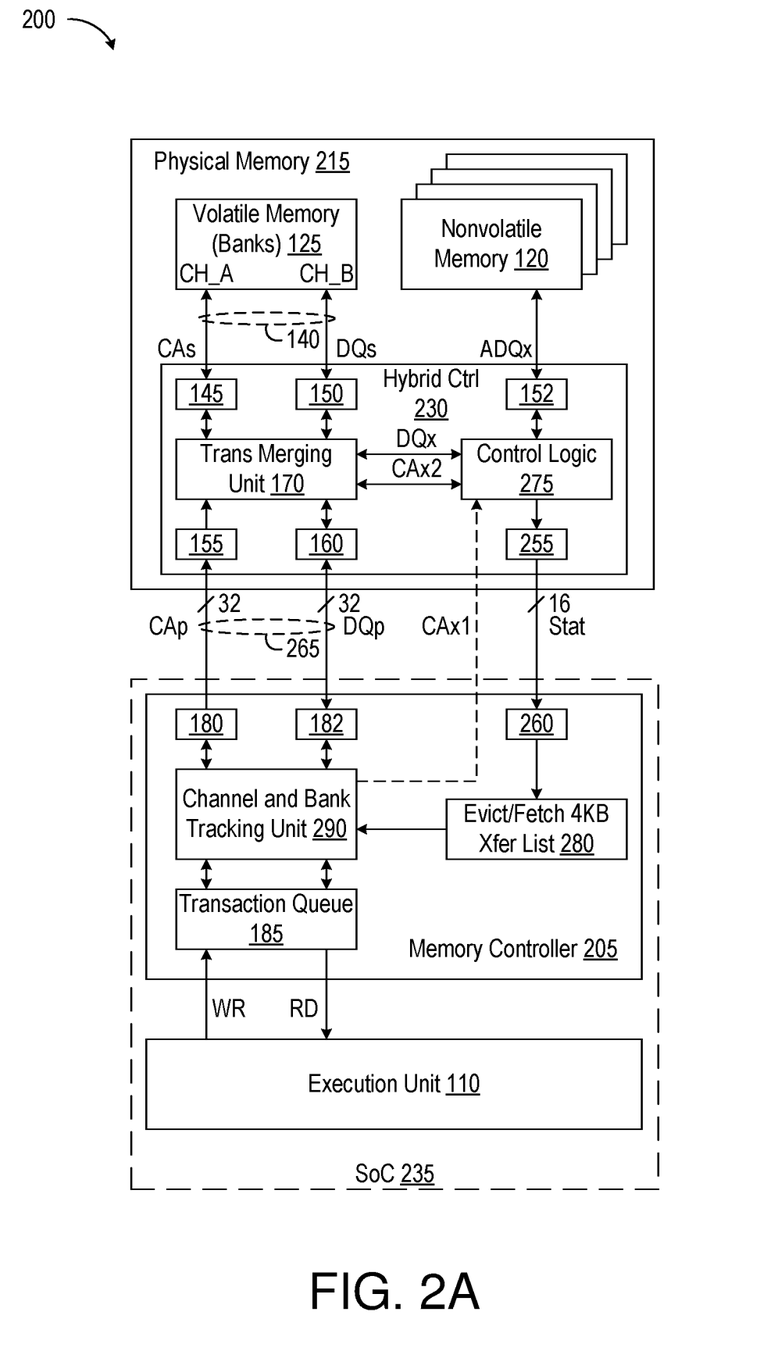

FIG. 2A depicts a compute system 200 that can in some ways be likened to system 100 of FIG. 1A, with like-identified elements being the same or similar. A memory controller 205 provides an execution unit 110 access to hybrid physical memory 215, which includes one or more slow memory components 120 and one or more fast memory components 125. As in the prior example, fast memory components 125 define a small address space that caches a high-locality subset of the instructions and data in the large address space. A hybrid controller component 230 linked to slow memory components 120 and fast memory components 125 copies 4 KB blocks of data between slow memory components 120 and fast memory components 125, in 64 B cache lines, as needed to maintain locality of reference.

Memory controller component 205 is linked to hybrid controller component 230 via a thirty-two link primary command interface CAp and a thirty-two link primary data interface DQp. Memory controller component 205 issues commands and communicates data in service of read and write requests from execution unit 110. Hybrid controller 230 is coupled to fast memory components 125 via links 140 coupled to DDR DRAM command/address and data interfaces 145 and 150. DDR commands specify a DRAM bank on one of two channels A and B (CH_A and CH_B). 64 B cache lines of data associated with read or write commands are conveyed bidirectionally over secondary data interface DQs in bursts over parallel data lines as DDR signals that transition on both rising and falling edges of a timing signal (not shown). Similar command/address and data interfaces 155 and 160 facilitate communication with memory controller component 105 via a primary command/address interface CAp and data interface DQp over links 265. Hybrid controller component 230 is also coupled to slow memory components 120 via an interface 152 and links ADQx in this example. Other embodiments can use different interfaces and different types of volatile and nonvolatile memory.

Hybrid controller component 230 fetches 4 KB blocks of data from slow memory components 120 to cache them in fast memory components 125 and evicts 4 KB blocks from fast memory components 125 as needed to make room for more recently used blocks. Block-wise operations each require sixty-four 64 B cache-line transactions (64×64 B=4 KB). Hybrid controller component 230 includes transaction-merging unit 170 and control logic 275 that note available DRAM transaction time slots and use them as needed in support of cache maintenance. Transaction-merging unit 170 responds to command/address signals on corresponding ports CAx2 and DQx in the same way it responds to similarly formatted signals from memory controller 205. Interfaces 255 and 260 report status information over sixteen status links Stat from control logic 275 in hybrid controller component 230 to a transfer list 280 maintained in memory controller 205.

Memory controller 205 is coupled to hybrid controller component 230 via links 265 served by DDR command/address and data interfaces 180 and 182. As in the example of FIG. 1A, transaction queue 185 maintains a list of pending memory transactions requested by execution unit 110, while a channel-and-bank tracking unit 290 keeps track of the banks, channels, and timings of those transactions. Tracking unit 290 knows, for example, which banks on which channels of fast memory components 125 will be busy for which $t_{RC}$ intervals.

Transactions within transaction queue 185 should take precedence over cache-maintenance operations. Otherwise, memory controller 205 will be interrupted by cache operations and speed performance will be reduced from the perspective of SoC 235. Control logic 275 within hybrid controller 230 thus relies on memory controller 205 to identify access slots during which physical memory 215 is not servicing memory transactions responsive to requests from execution unit 110. Communication from tracking unit 290 to control logic 275, represented as a dashed arrow CAx1 between the two, takes advantage of available bandwidth on command/address channel CAp in one embodiment.

Hybrid controller component 230 can wait for memory controller 205 to identify a needed access slot. In other embodiments control logic 275 passes the block address or addresses of needed banks to transfer list 280. Block addresses require few address bits and can thus be passed over efficient, low-speed links. Tracking unit 290 monitors requests in transaction queue 185 and looks for available access slots within which to service those requests. If an available slot is required, as indicated in transfer list 280, then tracking unit 290 inserts an alert in command/address traffic on primary interface CAp identifying the available bank and channel with the requisite timing to transaction-merging unit 170. Transaction-merging unit 170 relays this information to control logic 275. Memory controller component 230 then inserts cache-maintenance transactions into the available slot at the specified time. Control logic 275 can update transfer list 280 as block operations are accomplished.

Figure 2B:
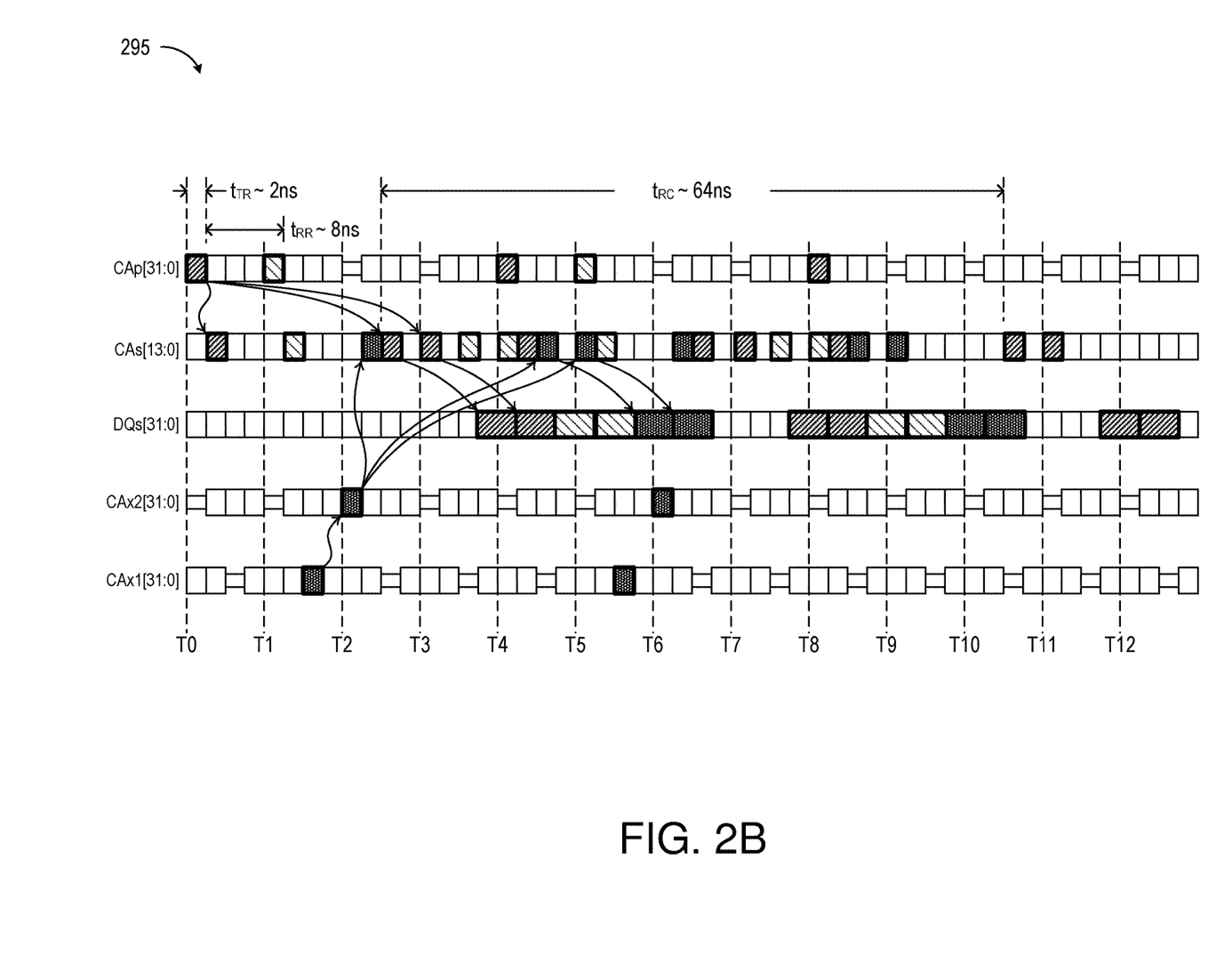
FIG. 2B is a timing diagram 295 illustrating how cache accesses to fast memory components 125 are inserted between execution-unit accesses for one channel in an embodiment of compute system 200 of FIG. 2A.

FIG. 2B is a timing diagram 295 illustrating how cache accesses to fast memory components 125 are inserted between execution-unit accesses in an embodiment of compute system 200 of FIG. 2A. The horizontal axis is divided into two-nanosecond (2 ns) clock cycles, fast memory components 125 has eight banks on each channel, each bank being independently accessible, a new bank every row-access time of eight nanoseconds ($t_{RR}$=8 ns). Sequential access to the same bank requires more time, sixty-four nanoseconds ($t_{RC}$=64 ns).

Memory controller component 205 can issue a 64 b command, which includes address and other bits, over a thirty-two-link primary command/address interface CAp on each cycle. A single such command can specify both a read or write command on behalf of execution unit 110 on one channel and a background, cache-maintenance read or write command for hybrid controller component 230 on a second channel. Only e.g. two of eight channels will start a new read/write access in each 2 ns clock cycle. Formatting for such a hybrid command is detailed below in connection with FIG. 3. The following discussion treats cache-maintenance commands separately, however, for ease of illustration.

Beginning at time T0 and responsive to a request from execution unit 110, memory controller 205 issues a read command 196 on primary interface CAp. (As with other transactions, the read command is represented as a block shaded in a manner that identifies it with related signals of the same transaction.) Hybrid controller component 230 responsively issues a sequence of commands on secondary interface CAs, a first command that identifies the channel, device, bank, and row where the requested data resides and successive commands that identify a pair of column addresses in fast memory components 125. The example assumes fast memory components 125 includes a type of DDR memory called LPDDR4, which specifies the width of interface CAs as seven bits per device—six for command/address and one for chip-select—for each of up to four channels. Activate, read, and write commands all have a duration of two DDR cycles, 28 b per command, so secondary interface CAs supports fourteen links. Each of the two commands with a column address produces thirty-two eight-bit bursts of read data, collectively a 64 B cache line (2×32×8 bits=64 B), which fast memory components 125 transmit on secondary data channel DQs. A second read command at time T1 likewise results in a 64 B cache line directly following the first on data channel DQs.

Controller 205 is not making use of the access slot available at time T2. Assuming the available bank is listed in list 280, tracking unit 290 issues a slot-availability command over channel CAx1 in time for controller logic 275 to issue a read command on interface CAx2. Hybrid controller component 230 responsively issues a sequence of commands on secondary interface CAs, once again a first command that identifies the channel and device where the requested data resides in fast memory components 125 and successive commands that identify a pair of row addresses. As a result, fast memory components 125 issue a 64 B cache line on secondary data channel DQs immediately following the cache line from the prior read transaction. The delay between commands on interface CAx1 and the available slot can be a fixed pipeline delay adjusted to be long enough to accommodate hybrid controller component 230.

The example of FIG. 2B continues with read or write transactions over the same DRAM channel initiated by execution unit 110—at times T4, T5, and T8—and for cache maintenance at time T6. Secondary data channel DQs thus services execution unit 110 without interruption while allocating resources for cache maintenance. Though not shown, cached data are routed through transaction-merging unit 170, data interface DQx, and control logic 275 for writing to and reading from slow memory components 120.

Figure 3:
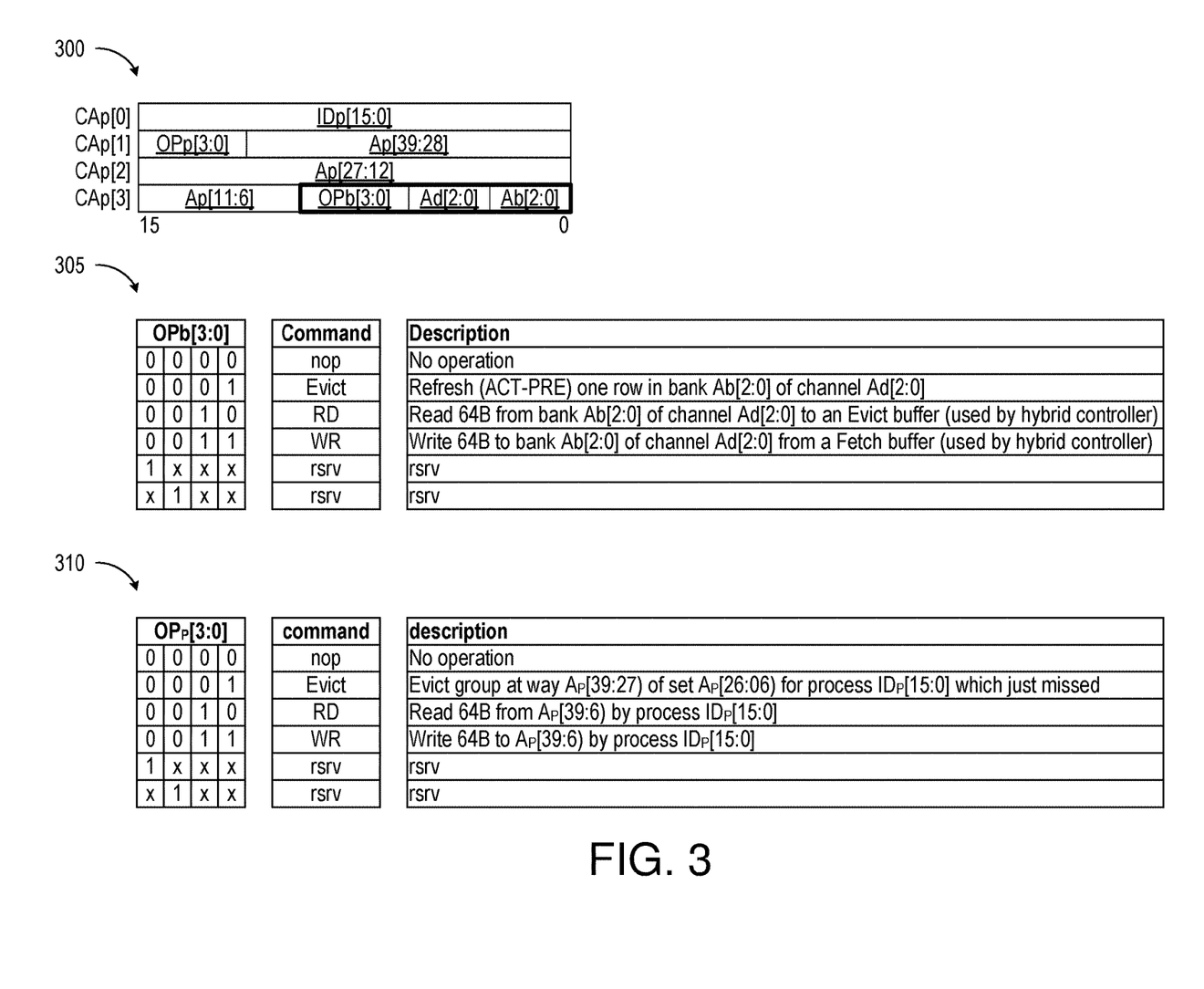
FIG. 3 illustrates a command format 300 for commands passed from memory controller 205 to physical memory 215 over primary command/address channel CAp.

FIG. 3 illustrates a command format 300 for commands passed from memory controller 205 to physical memory 215 over primary command/address channel CAp. This format passes two access-slot commands to hybrid controller component 230 on each 2 ns internal clock cycle. The signaling rates for command and status signals can match the data signaling rate, and all signals can be communicated using e.g. similar point-to-point topologies. Other signaling-rate ratios and topologies can be used in other embodiments. The first access-slot command, highlighted with a bold boundary, includes three fields associated with an available bank to allow hybrid controller component 230 to perform a cache-line operation over a first memory channel: field OPb[3:0] specifies an op code for hybrid controller component 230; field Ad[2:0] specified a device channel; and field Ab[2:0] specifies an available bank. A table 305 lists op codes OPb[3:0] available in this embodiment. The second access-slot command is directed to a second channel and row of fast memory components 125, and thus requires more address bits than the first access-slot command. Field IDp[15:0] specifies a process; field OPp[3:0] specifies an operational code ("op code") for the process; and fields Ap[39:38], Ap[27:12], and Ap[11:6] specify the address in physical memory 215 for the process. A table 310 lists op codes OPp[3:0] available in this embodiment.

Hybrid controller component 230 maintains fetch and evict buffers (not shown) within control logic 275 to keep track of which cache lines in a given block have yet to be dealt with as part of a cache-maintenance operation. When moving a 4 KB block from slow memory components 120 to fast memory components 125, for example, hybrid controller component 230 copies the block into a local fetch buffer. Hybrid controller component 230 then transfers the block one 64 B cache line at a time as memory controller the 205 identifies available access slots. With reference to table 310, for example, memory controller 205 can issue a command in format 300 with op code OBb=0011 suggesting that hybrid controller component 230 can write a cache line to a bank Ab[2:0] on a channel Ad[2:0] from the fetch buffer. Hybrid controller component 230 can take advantage of the available cache line access slot by inserting an as-yet-uncopied cache line from the fetch butter into fast memory components 125. Hybrid controller component 230 likewise employs an evict buffer to copy dirty cache lines from fast memory components 125 to slow memory components 120.

Figure 4:
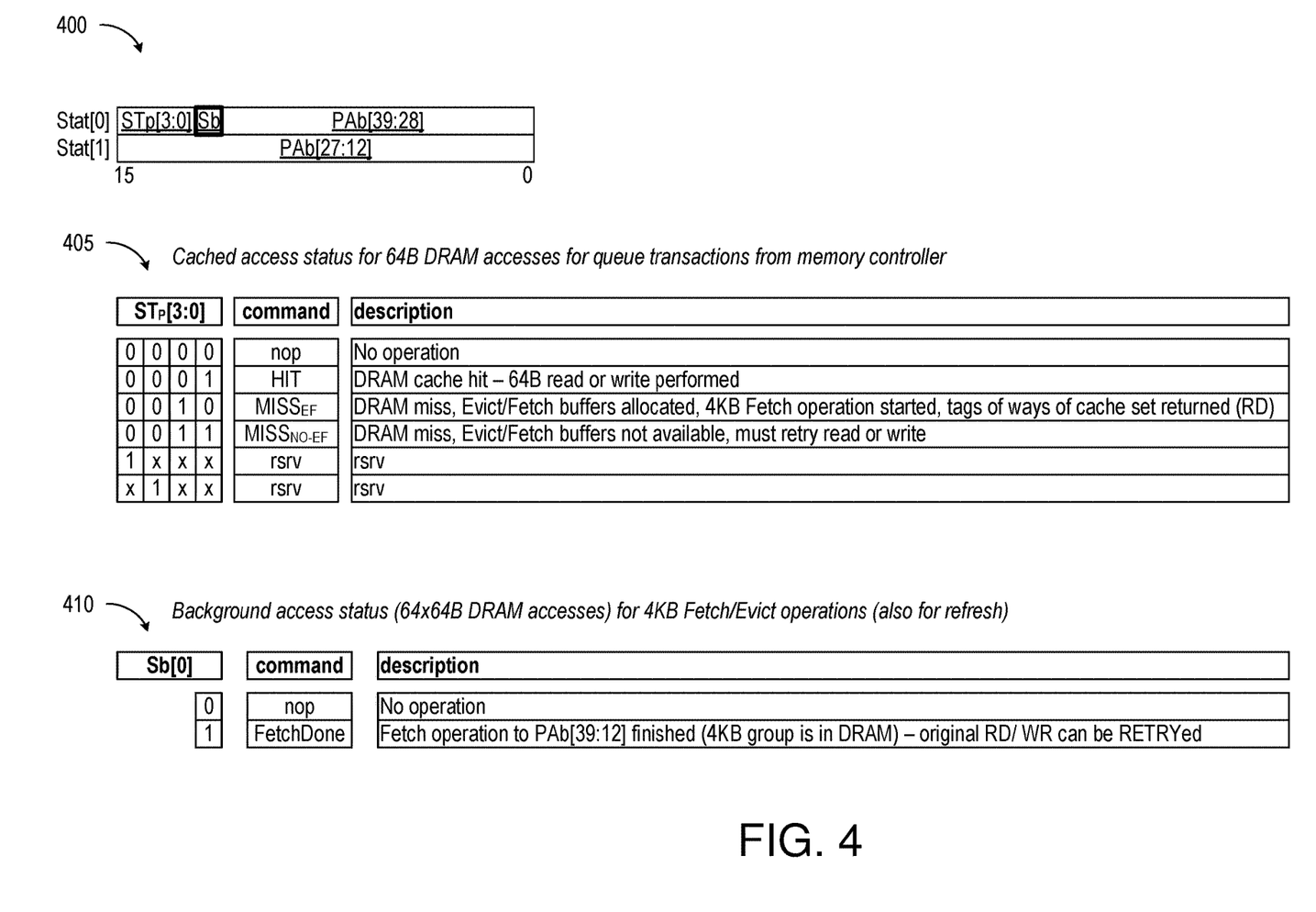
FIG. 4 illustrates a command format 400 for commands passed from hybrid controller component 230 to memory controller 205 to physical memory 215, over primary command/address channel CAp in this example.

FIG. 4 illustrates a command format 400 for commands passed from hybrid controller component 230 to memory controller 205 to physical memory 215, over primary command/address channel CAp in this example. One such thirty-two-bit command can be transmitted as a "status packet" on each 2 ns internal clock cycle as consecutive sixteen-bit portions Stat[0] and Stat[1]. These commands report cache hit and miss tag-compare results for read and write accesses that occurred some selected number of clock cycles earlier. The commands also signal completion of cache fetch operations. Status packets include bits sufficient to occasionally report back a large portion of a physical address. Smaller status packet formats that report back fewer status bits per packet can be used in other embodiments.

Command format 400 passes two types of status fields. Status field STp[3:0] relates cache access status for 64 B cache line accesses to an address PAb[39:12] for transactions in queue 185 on memory controller 205. A table 405 lists the available op codes and related functionality. Status field Sb[0], as noted in a table 410, can be set to one to signal completion of a fetch operation to address PA[39:12], alerting memory controller 205 that a read or write to that address can be retried.

Figure 5A:
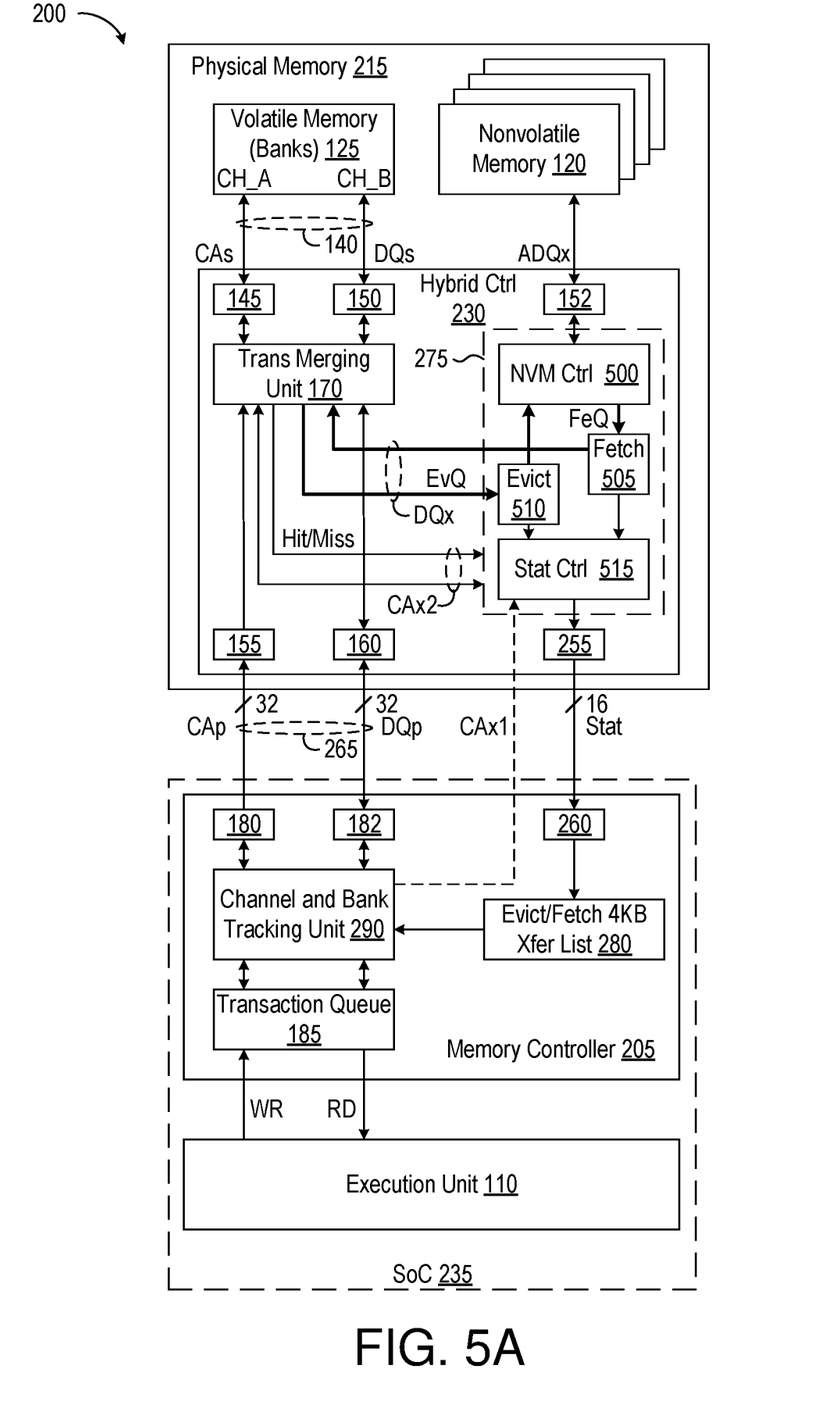
FIG. 5A depicts compute system 200 of FIG. 2A with additional details of control logic 275 that illustrate how 4 KB cache fetch and evict operations are manage in accordance with one embodiment.

FIG. 5A depicts compute system 200 of FIG. 2A with additional details of control logic 275 that illustrate how 4 KB cache fetch and evict operations are manage in accordance with one embodiment. As detailed previously, hybrid controller component 230 fetches 4 KB blocks of data from slow memory components 120 to cache them in fast memory components 125 and evicts 4 KB blocks from fast memory components 125 as needed to make room for more recently used blocks. A slow-memory-component controller 500 employs fetch and evict data buffers 505 and 510 to manage this movement of fetch data FeQ and eviction data EvQ to and from fast memory components 125 via transaction merging unit 170. A status controller 515 reports status information over sixteen status links Stat using the command format of FIG. 4.

Figure 5B:
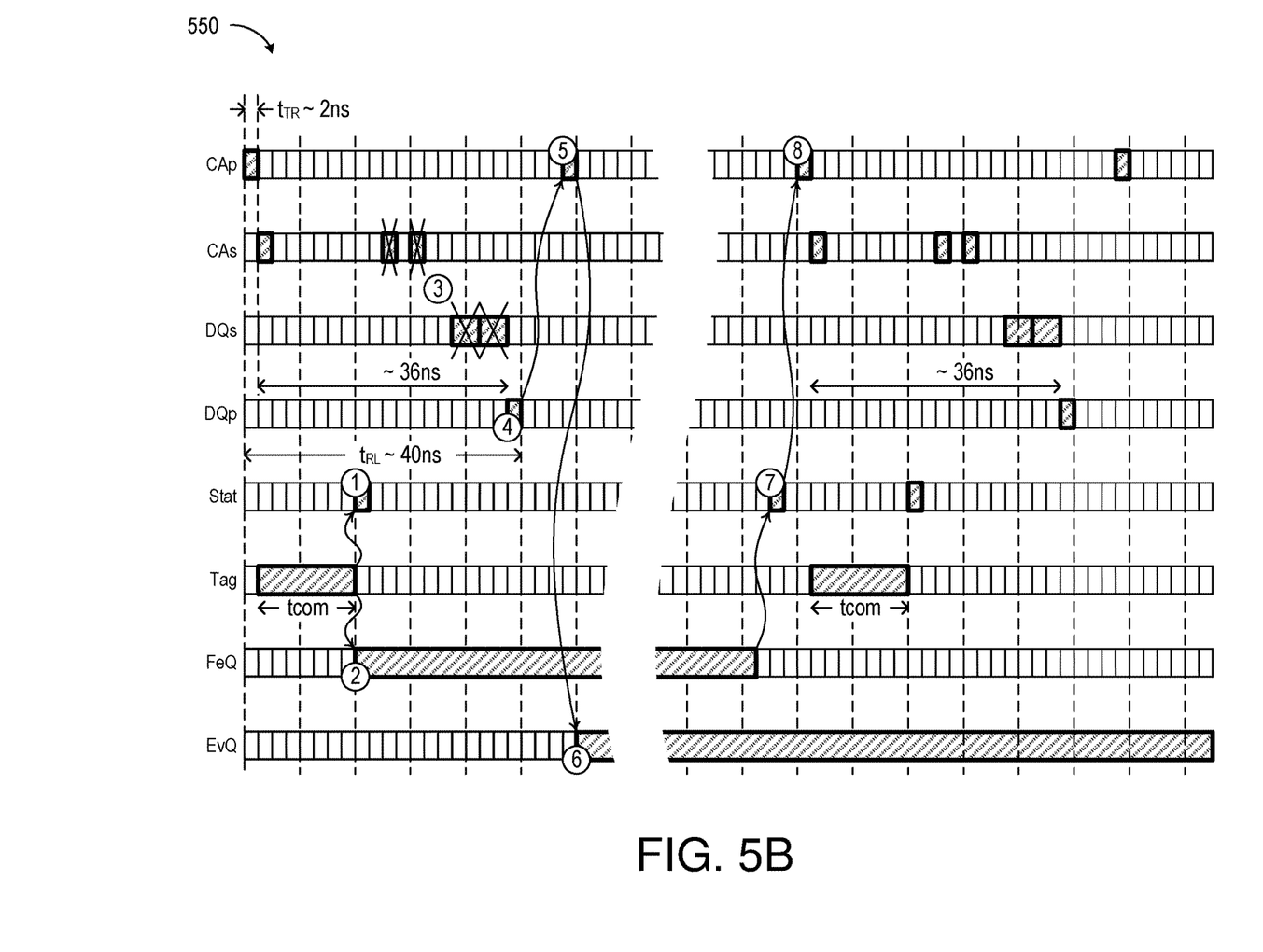
FIG. 5B is a timing diagram 550 illustrating the flow of fetch and evict traffic between fast memory components 125 and slow memory components 120 of compute system 200 as illustrated in FIG. 5A.

FIG. 5B is a timing diagram 550 illustrating the flow of fetch and evict traffic between fast memory components 125 and slow memory components 120 of compute system 200 as illustrated in FIG. 5A. This example depicts read timing for a cache miss, which is to say when data requested by controller 205 does not reside in fast memory components 125. Operational steps are ordered in a manner illustrated using numbered circles.

Hybrid controller 230 stores cached data in fast memory components 125 in association with address tags that map to addresses in slow memory components 120. Transaction merging unit 170 compares address bits of incoming commands on channel CAp to the address tags in fast memory components 125 to detect a "hit" (data in cache) or "miss" (data not in cache). In this example, beginning at left in diagram 550, memory controller component 205 issues a 64b read command on channel CAp that includes the physical address of the requested data. Transaction merging unit 170, after a tag-comparison time $t_{com}$, indicates a cache miss to status controller 515 and nonvolatile memory controller 500. Status controller 515 issues a status signal Stat (circle 1) alerting memory controller 205 of the miss and nonvolatile controller 500 begins copying the requested data from slow memory components 120 to 4 KB fetch buffer 505 (circle 2). Transaction merging unit 170 also cancels the requested column access, an operation illustrated by crossing out signals on channels CAs and DQs (circle 3).

Controller 230 returns the 32×16 b tag (64 B) from memory component 125 to controller 205 in lieu of the requested read data (circle 4). Controller 205, interpreting the returned tag in view of the indicated status, uses the tag to select a 4 KB group to evict from fast memory components 125. In one embodiment controller 205 follows a cache-eviction policy that evicts the least-recently used block of data.

Controller 205 issues a command on channel CAp instructing controller 230 to evict the identified 4 KB block (circle 5). The IDp[15:0] field of command format 300 (FIG. 3) identifies the process that generated a transaction to allow hybrid controller component 230 to decide which 4 KB groups to evict in consequence of a cache miss. Controller 230 responsively begins the eviction process by moving the evicted data block into eviction buffer 510 via channel EvQ (circle 6). The fetch access to buffer 505 is moved to fast memory components 125 as a series of 64 background write accesses of 64 B each, with each 64 B write using a background slot provided by memory controller 205. Status controller 515 communicates completion of the fetch process to controller 205 (circle 7). Physical address field Ap[39:12] of command format 300 indicates when a fetch is completed, and the transaction can thus be retried. Controller component 205 responsively retries the read command that first met with a cache miss (circle 8). The requested read data is fast memory components 125 this time and the read operation proceeds accordingly.

While the subject matter has been described in connection with specific embodiments, other embodiments are also envisioned. Other variations will be evident to those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A memory module comprising:
   at least one slow memory component defining a large address space, the large address space to store data at slow-memory-component addresses;
   at least one fast memory component defining a small address space, the small address space to cache the data stored in the large address space;
   a hybrid controller component linked to the slow memory component and the fast memory component, the hybrid controller component to issue a request for at least one access time slot, receive an access-time-slot command identifying a requested access time slot responsive to the request for at least one access time slot, and, responsive to the access-time-slot command, copy a cache line in the requested access time slot from the slow memory component to the fast memory component; and
   a command interface to pass the request for at least one access time slot and the access-time-slot command;
   wherein the access-time-slot command is a first access-time-slot command directed to a first bank of the fast memory and is received in a command format that includes a second access-time-slot command directed to a second bank of the fast memory.

2. The memory module of claim 1, wherein the hybrid controller groups the cache line with other cache lines in a block, and wherein the request for at least one access time slot identifies the block.

3. The memory module of claim 1, wherein each of the access time slots comprises a timeframe for accessing a bank of the fast memory.

4. The memory module of claim 1, wherein the first access-time-slot command specifies fewer address bits than the second access-time-slot command.

5. The memory module of claim 1, wherein a cache line comprises 64 B.

6. The memory module of claim 1, wherein the fast memory component comprises flash memory cells and the cache lines are organized in 4 KB blocks.

7. A hybrid controller to manage memory transactions between a memory controller and a fast memory component and to schedule cache-maintenance operations between the fast memory component and a slow memory component, the hybrid controller comprising:
   control logic to issue a request to the memory controller for at least one access time slot, receive an access-time-slot command identifying a requested access time slot responsive to the request for at least one access time slot, and copy a cache line in the requested access time slot from the slow memory component to the fast memory component; and
   a command interface to pass the request for at least one access time slot and the access-time-slot command;
   wherein the access-time-slot command is a first access-time-slot command directed to a first bank of the fast memory and is received in a command format that includes a second access-time-slot command directed to a second bank of the fast memory.

8. The hybrid controller of claim 7, wherein copying the cache line in the requested access comprises a cache transaction to the fast memory component, the hybrid controller further comprising a transaction-merging unit to schedule the cache transaction and the memory transactions.

9. The hybrid controller of claim 7, wherein the control logic groups the cache line with other cache lines in a block, and wherein the request for at least one access time slot identifies the block.

10. The hybrid controller of claim 7, wherein each of the access time slots comprises a timeframe for accessing a bank of the fast memory.

11. The hybrid controller of claim 7, wherein the first access-time-slot command specifies fewer address bits than the second access-time-slot command.

* * * * *